(12) United States Patent
Peretto

(10) Patent No.: US 8,686,716 B2
(45) Date of Patent: Apr. 1, 2014

(54) ELECTRICAL CURRENT AND/OR VOLTAGE SENSOR WITH A SCREENING ELEMENT FOR A SOURCE ELECTRODE AND ELECTRICAL FIELD SENSOR

(75) Inventor: Lorenzo Peretto, Rovigo (IT)

(73) Assignee: Green Seas Venture, Ltd., Tortola (VG)

( * ) Notice: Subject to any disclaimer, the term of this patent is extended or adjusted under 35 U.S.C. 154(b) by 199 days.

(21) Appl. No.: 13/123,027

(22) PCT Filed: Nov. 11, 2009

(86) PCT No.: PCT/IT2009/000504
§ 371 (c)(1),
(2), (4) Date: Apr. 13, 2011

(87) PCT Pub. No.: WO2010/058435
PCT Pub. Date: May 27, 2010

(65) Prior Publication Data
US 2011/0204879 A1    Aug. 25, 2011

(30) Foreign Application Priority Data
Nov. 18, 2008   (IT) .............................. BO20080084 U

(51) Int. Cl.
*G01R 15/18* (2006.01)
*H01F 27/02* (2006.01)

(52) U.S. Cl.
USPC .............. 324/127; 324/126; 324/686; 336/92

(58) Field of Classification Search
USPC ................. 324/327, 117, 658–690, 126, 127; 336/92
See application file for complete search history.

(56) References Cited

U.S. PATENT DOCUMENTS

| | | | |
|---|---|---|---|
| 2,924,796 A | 2/1960 | Stauber | |
| 4,591,942 A | 5/1986 | Willard | |
| 4,701,738 A | 10/1987 | Preissinger | |
| 5,128,608 A * | 7/1992 | Ochi | ................................ 324/96 |
| 5,473,244 A * | 12/1995 | Libove et al. | .................. 324/126 |
| 5,933,012 A | 8/1999 | Bengtsson | |
| 6,515,468 B1 | 2/2003 | Morimoto | |
| 2008/0001694 A1 | 1/2008 | Wang | |

FOREIGN PATENT DOCUMENTS

| | | | |
|---|---|---|---|
| DE | 3540547 A1 * | 5/1987 | .............. H01F 40/06 |
| EP | 0867725 A | 9/1998 | |
| EP | 1515146 A | 3/2005 | |
| WO | 0186309 A | 11/2001 | |

OTHER PUBLICATIONS

Machine Translation of DE 3,540,547 A1.*
Machine Translation of DE 3,540,547 A1, Translation date Apr. 17, 2013.*

* cited by examiner

*Primary Examiner* — Patrick J Assouad
*Assistant Examiner* — Alexander J Nemtzow
(74) *Attorney, Agent, or Firm* — Andrew Wilford

(57) ABSTRACT

A current or voltage sensor for use with a busbar has a support body having a proximal end juxtaposed with the busbar and a distal end spaced therefrom and a U-shaped conducting bar in the proximal end and having a pair of arms having free ends transversely engaging the busbar. A Rogowski coil in the proximal end is juxtaposed with the U-shaped conducting bar. A grounded screening element at the distal end is conductive and forms a chamber open toward the U-shape conducting bar. A source electrode has a proximal end engaging the U-shaped conducting bar outside the first chamber and a distal end in the chamber. An electrical field sensor in the first chamber is juxtaposed with the distal end of the source electrode.

8 Claims, 9 Drawing Sheets

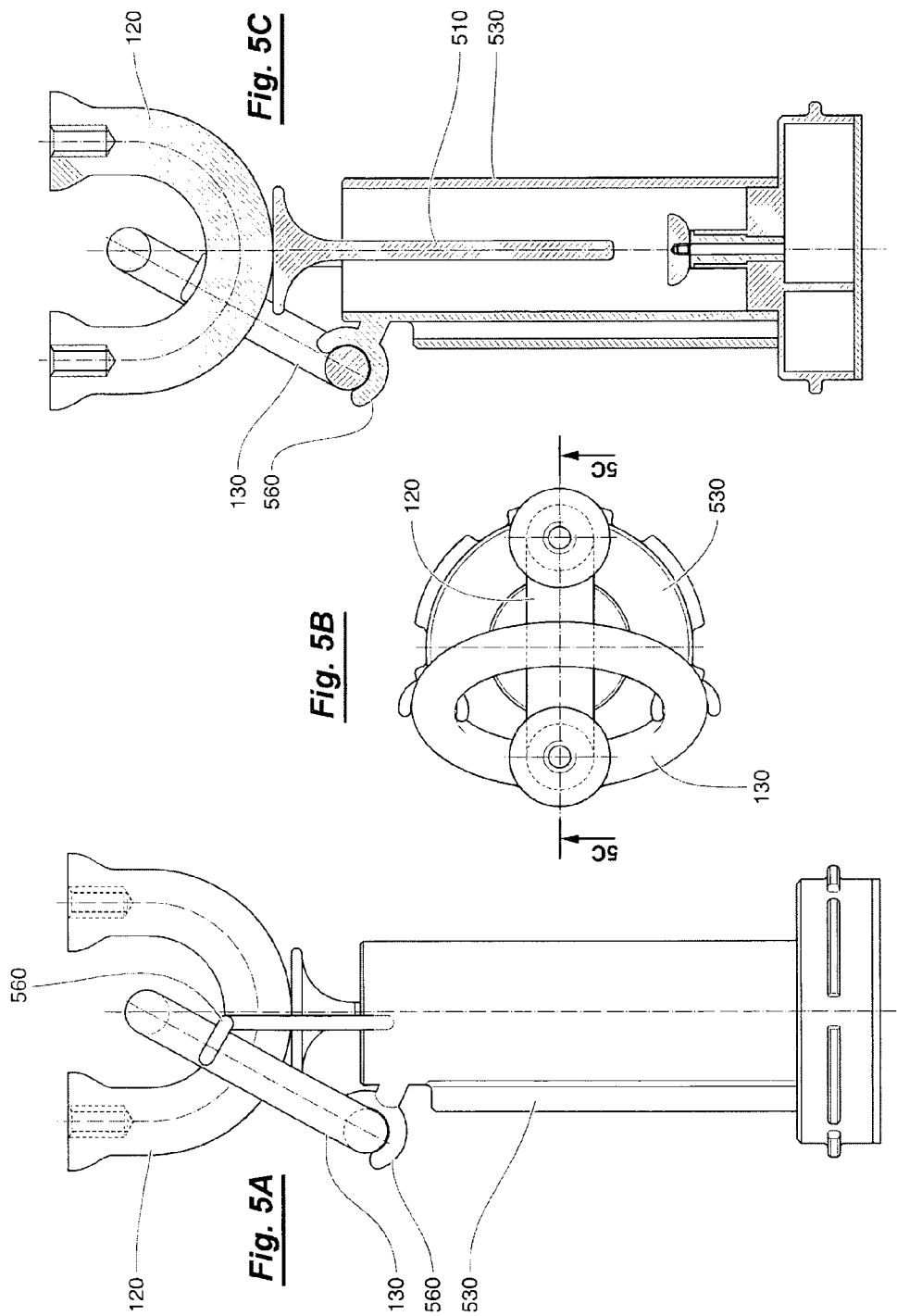

US 8,686,716 B2

ELECTRICAL CURRENT AND/OR VOLTAGE SENSOR WITH A SCREENING ELEMENT FOR A SOURCE ELECTRODE AND ELECTRICAL FIELD SENSOR

CROSS REFERENCE TO RELATED APPLICATIONS

This application is the US national stage of PCT application PCT/IT2009/000504, filed 11 Nov. 2009, published 27 May 2010 as 2010/058435, and claiming the priority of Italian patent application BO2008U000084 itself filed 18 Nov. 2008.

FIELD OF THE INVENTION

The present invention relates to a current and/or voltage sensor.

PRIOR ART

There are known current and/or voltage sensors, but these have rather large overall dimensions and characteristics which prevent their rapid installation on a live busbar.

Said known sensors are also very heavy because of their extremely large bulk.

OBJECT OF THE INVENTION

The object of the present invention is to overcome the aforementioned drawbacks.

SUMMARY OF THE INVENTION

The invention, whose features are described in the claims, resolves the problem of creating a current and/or voltage sensor intended for use in combination with a busbar, in which said sensor extends along a longitudinal axis, thus forming a proximal and a distal portion with respect to said busbar, in which said sensor comprises electrical members, and in which said sensor is characterized in that it comprises a U-shaped conducting bar extending longitudinally along its longitudinal axis, and in that one or more sensors are placed in the proximity of said U-shaped conducting bar.

BRIEF DESCRIPTION OF THE APPENDED DRAWINGS

The following description of the construction system proposed by the present invention, in various practical embodiments, is provided by way of non-limiting example and makes reference to the appended drawings, in which.

Figure 5:
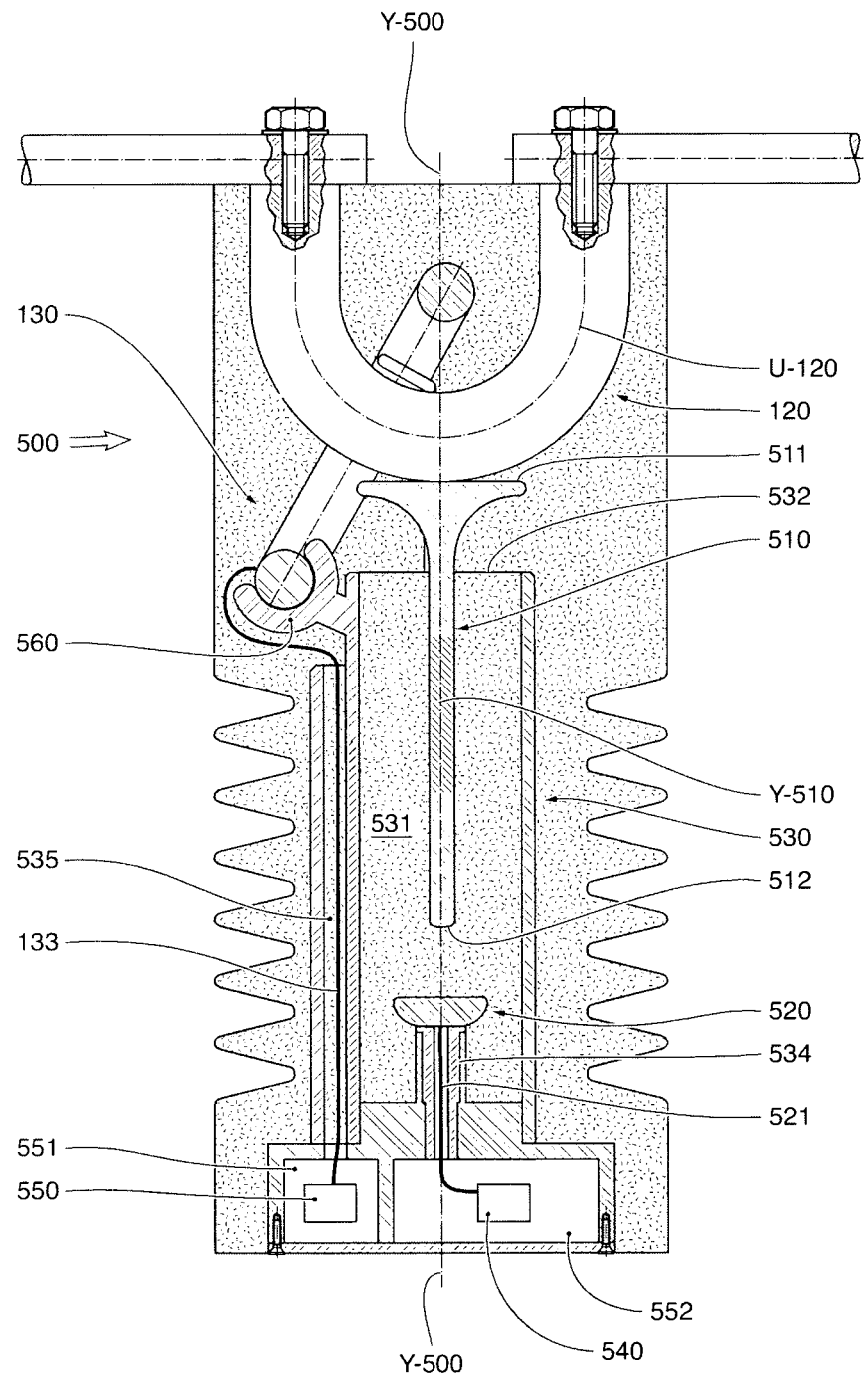
FIG. 5 shows the invention in a fifth practical embodiment.
Figure 6:
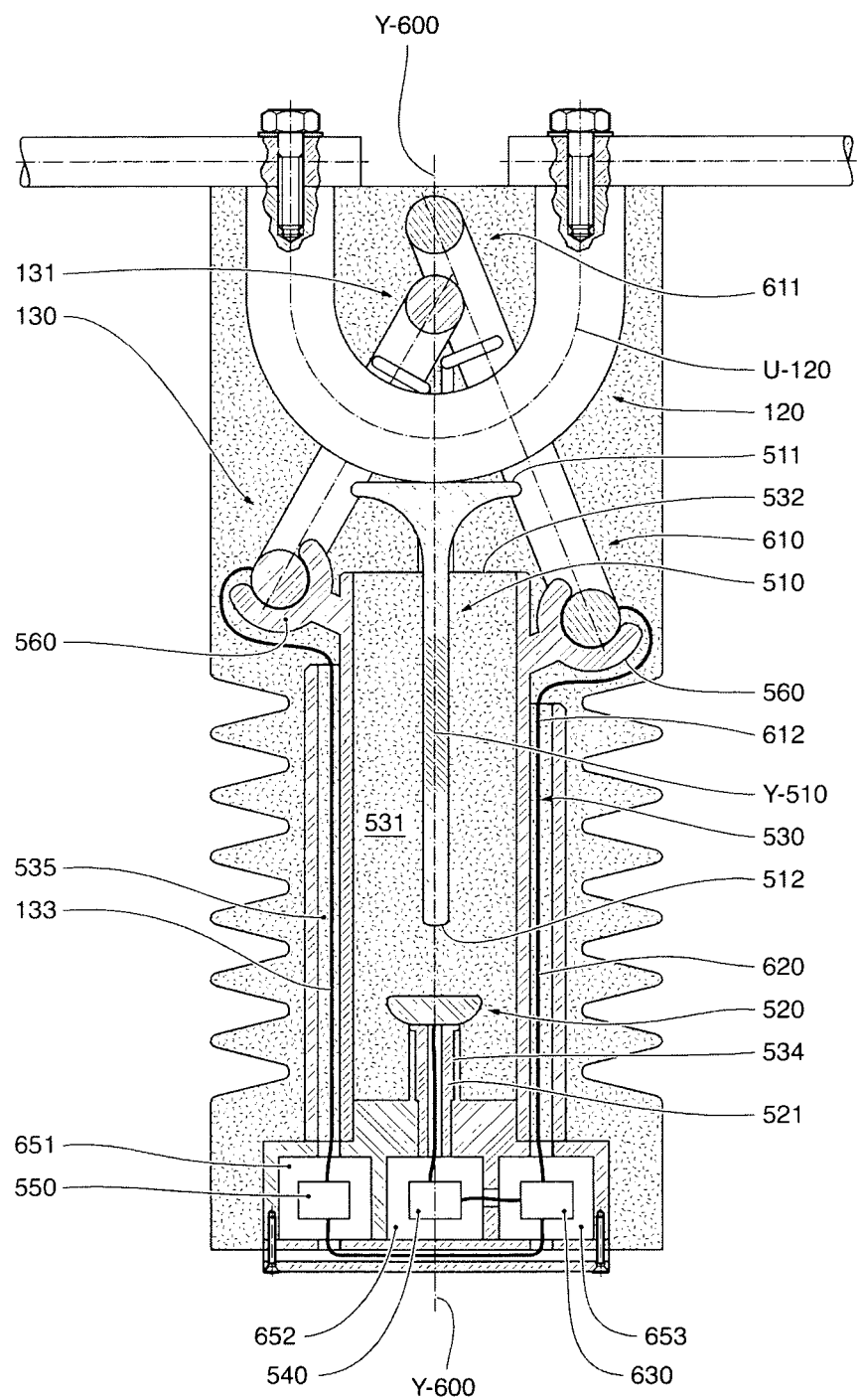

FIGS. 5.A, 5.B, and 5.C are, respectively, a front view, a view from above, and a view along the cross section line 5C-5C of FIG. 5.B, of the specific construction system of FIG. 5;

FIG. 6 shows the invention in a sixth practical embodiment.

SPECIFIC DESCRIPTION OF THE INVENTION

With reference to the following description, the present invention relates to a current and/or voltage sensor intended for use in combination with a busbar B to which it will be connected, in which said configuration, in its various practical embodiments (see the corresponding drawings), extends along a longitudinal axis Y forming a proximal portion and a distal portion with respect to said busbar B, and in which said configuration comprises a U-shaped conducting bar 120 which extends longitudinally along its longitudinal axis U-120 and one or more sensors and/or electrical components, 130/250/360/450/510-520/610, placed in the proximity of said U-shaped conducting bar 120.

In an exemplary, but not exclusive, embodiment, said U-shaped conducting bar 120 and said one or more sensors are placed and positioned with respect to each other by complete or partial embedding and incorporation in a solid body 110 of self-supporting dielectric material.

The arms of the U-shaped conducting bar 120 extend longitudinally with respect to said sensor, in other words in such a way that they are substantially parallel to the longitudinal axis Y of the sensor, with the free ends of said U-shaped conducting bar facing the proximal end of the sensor and is with the sensors positioned around, and spaced radially from, said U-shaped conducting bar.

Figure 1:
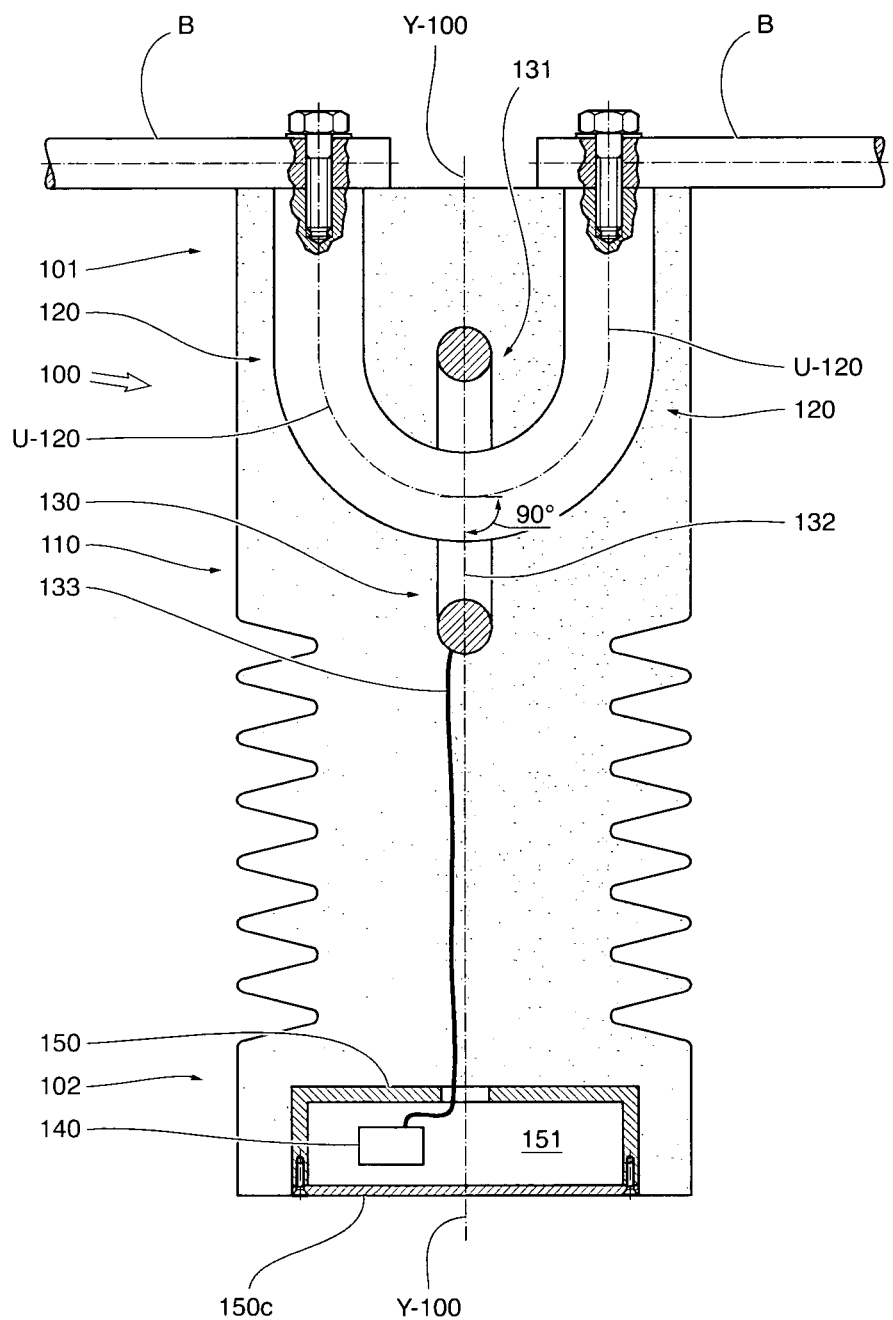
FIG. 1 shows the invention in a first practical embodiment.
Figure 2:
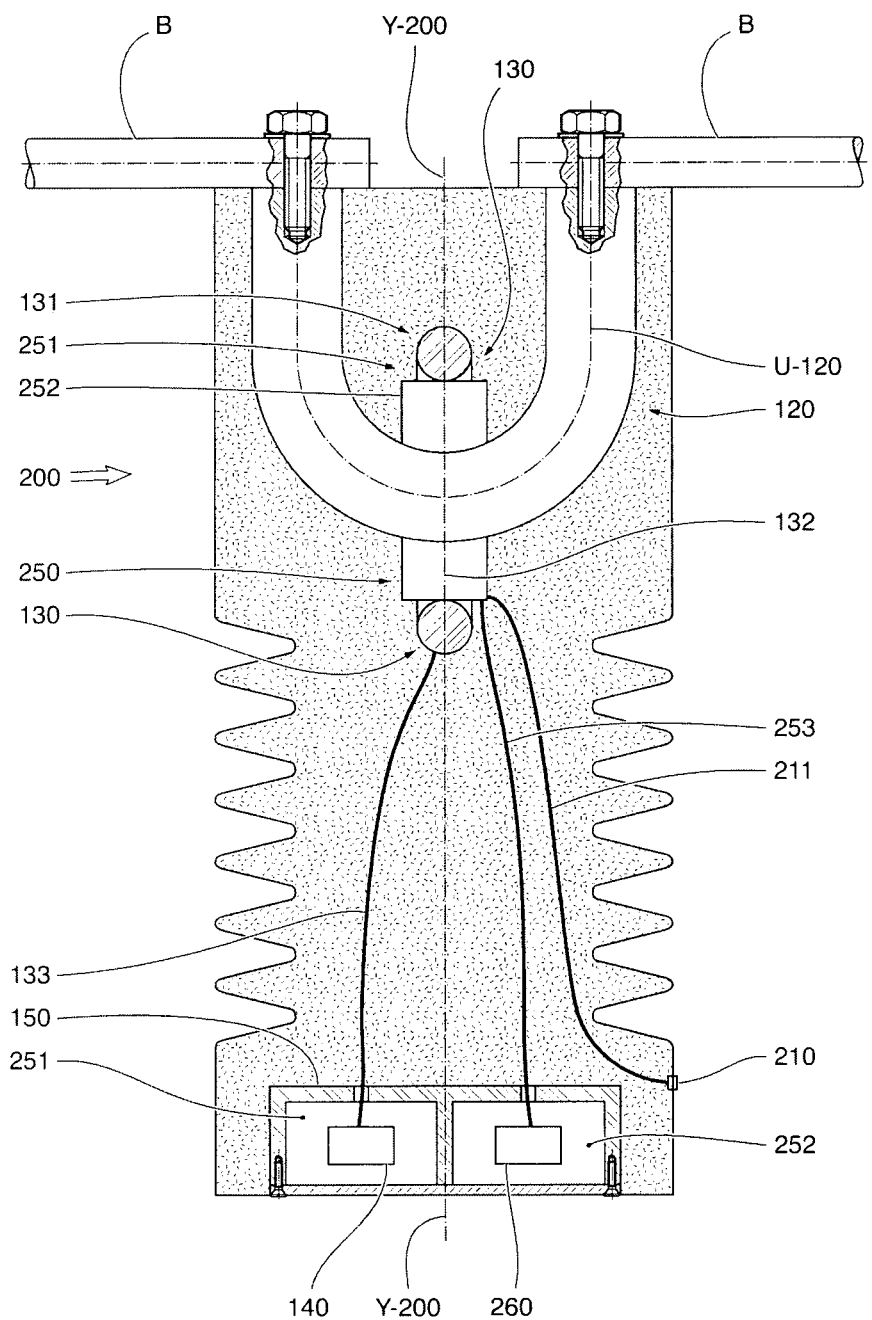
FIG. 2 shows the invention in a second practical embodiment.

Said sensors, such as those identified by 130 in FIG. 1 or 250 in FIG. 2, are preferably positioned at least partially between the arms of said U-shaped conducting bar 120, and electrical components, such as that identified by 510 in FIG. 5, can also be connected to said U-shaped conducting bar.

As explained more fully below, the aforesaid sensors can be of various types, such as electrical sensors for detecting the electrical field generated by said U-shaped conducting bar and/or sensors for detecting the magnetic field generated by said U-shaped conducting bar, said sensors being supported and positioned with respect to said U-shaped conducting bar by means of supporting branches.

As explained more fully below, the electrical components can be of various types, such as source electrodes for generating their own electrical fields.

Additionally, in order to make said sensor immune to the surrounding electrical fields generated by other busbars, the solid body 100 can comprise a screening element 150/530 designed to form one or more screened chambers.

Figure 3:
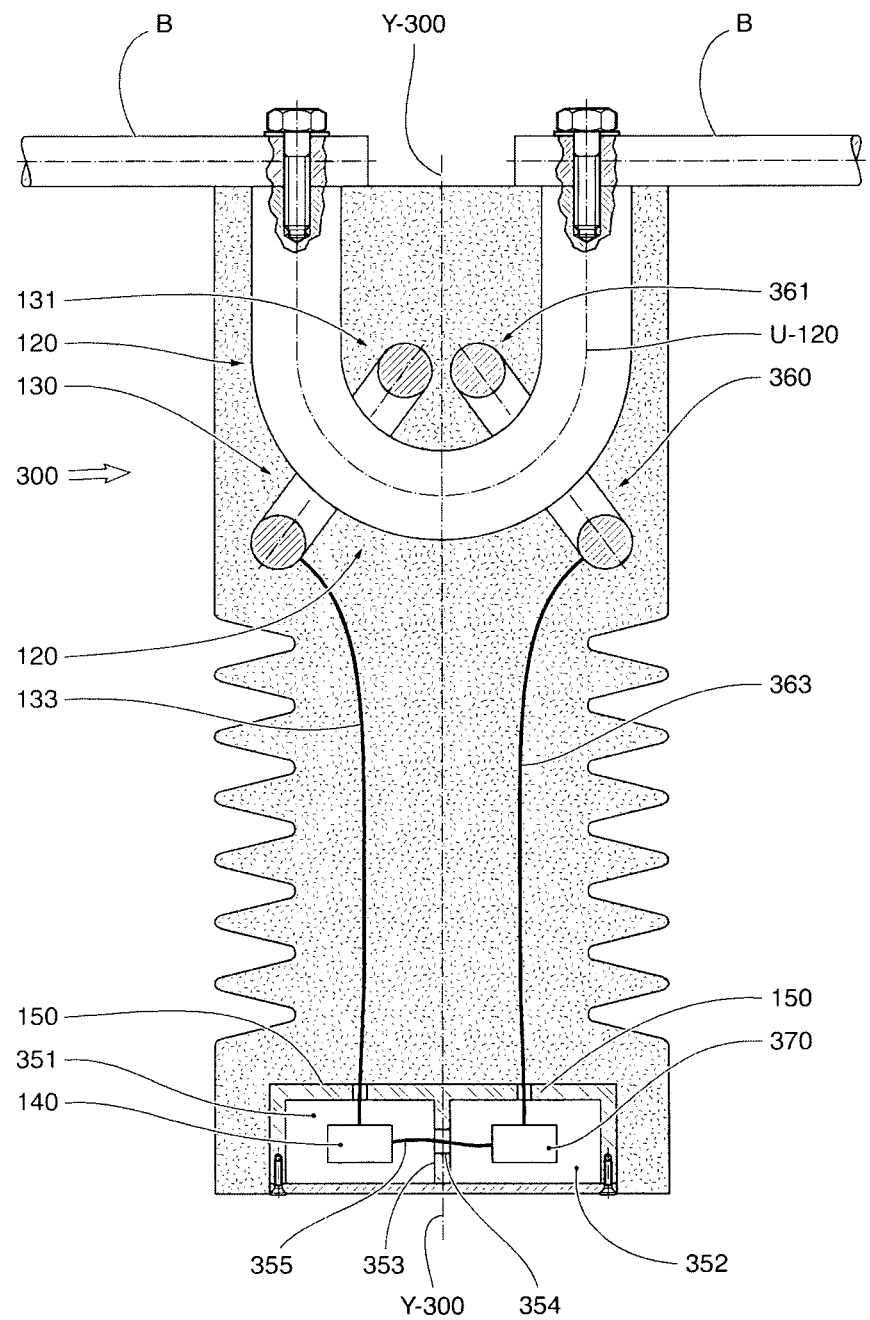
FIG. 3 shows the invention in a third practical embodiment.

As will also be explained more fully below, it is also possible to place one or more coils around said U-shaped bar if desired, as shown in FIGS. 3, 3.A, 4 and 4.A, with the proximal portions of said coils placed between the arms of said U-shape, and also, as shown in FIGS. 5 and 6, to provide one or more source electrodes associated with said U-shaped bar in order to form a capacitive sensor for detecting the electrical field emitted by said source electrode.

With reference to said one or more coils, these are preferably of the screened type, with the screen connected to earth or to a reference potential.

Figure 4:
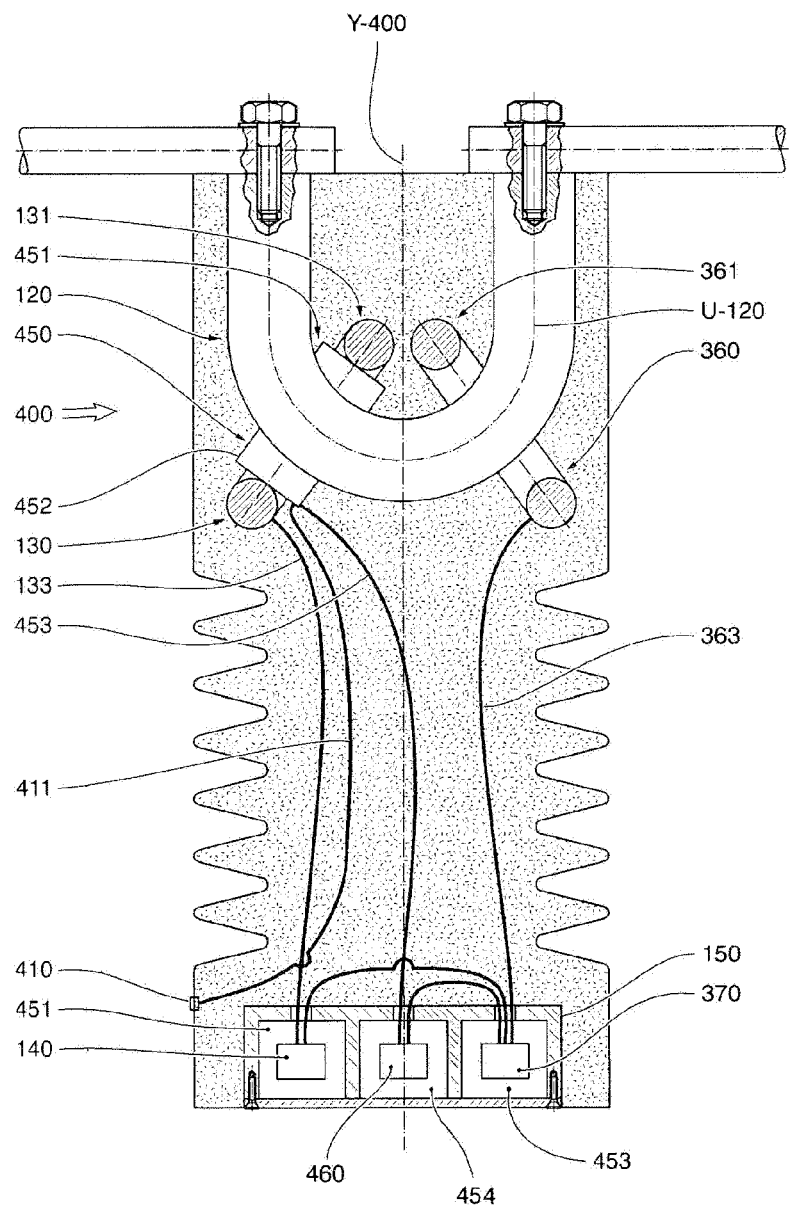
FIG. 4 shows the invention in a fourth practical embodiment.

If two coils are provided around said U-shaped bar 120, as shown in FIGS. 3 and 4, the proximal portions 131 and 361 of said two coils 130 and 360 can be placed on the two opposite transverse sides of the longitudinal axis Y of the sensor, or, if preferred, can be placed one above the other on the said axis Y of the sensor, as shown in FIGS. 3.A and 4.A.

Finally, said body of dielectric material 110 can preferably be provided with fins and can have a longitudinal extension such that the sensor also has the characteristics of an electrical insulator.

Description of the First Embodiment

FIG. 1

With reference to FIG. 1, this shows a first embodiment of the construction system proposed by the present invention.

In this first embodiment, a construction system is shown for a current sensor 100 for use in combination with a busbar B, in which said sensor 100 extends along a longitudinal axis Y-100.

Said sensor 100 comprises a solid body 110 of dielectric material which extends longitudinally along the axis Y-100 of the sensor 100, said body 110 having a proximal portion 101 and a distal portion 102 with respect to said busbar B.

A conducting bar 120 and a Rogowski coil 130 are embedded and positioned in said body 110, said conducting bar 120 being made in a U-shape extending longitudinally along the longitudinal axis U-120, while the Rogowski coil 130 is positioned around, and spaced radially from, said U-shaped conducting bar 120, with a proximal portion 131 of the coil placed between the arms of said U-shape.

The Rogowski coil 130 is preferably screened, with the screen connected to earth or to a reference potential, for example by means of a lead (not shown) connected to a screening element 150, described more fully below, this element being connected to earth or to a reference potential.

It is also preferable for said Rogowski coil 130 to be positioned so that it lies in a plane 132 extending perpendicularly to the axis U-120 of said U-shaped bar 120, and for said U-shaped conducting bar 120 to have a circular cross section.

The aforesaid first Rogowski coil 130 is provided with a lead 133 for the transmission of the signal from the coil, said lead 133 being connected to a first signal processing circuit 140, said processing circuit 140 preferably being placed inside a screened chamber 151, said chamber 151 being formed from an internally hollow screening element 150 made from conducting material, connected to earth or to a reference potential, said element 150 being embedded in said body 110 of dielectric material in the proximity of the distal portion 102 of the sensor 100 and being provided with a removable cover 150c.

Description of the Second Embodiment

FIG. 2

With reference to FIG. 2, this shows a second embodiment of the construction system proposed by the present invention, intended to provide a sensor indicated here by 200, is extending along an axis Y-200.

This second embodiment differs from the first embodiment shown in FIG. 1 in that it also contains a capacitive sensor 250 placed in the proximity of said U-shaped bar with at least one proximal portion, 251, of this sensor placed between the arms of said U-shape.

More specifically, said capacitive sensor 250 comprises a first metal capacitor armature 252, preferably ring-shaped, made from sheet metal and/or metal mesh and/or other material, said first armature 252 being placed around the U-shaped bar 120 and being spaced from it by the dielectric material, the U-shaped bar acting as a second metal armature of said capacitive sensor 250, and, more specifically and preferably, said first armature 252 being placed and positioned circumferentially in the proximity of the inner diameter of the Rogowski coil 130.

Said capacitive sensor 250 with its capacitor armature 252 is provided with a lead 253 for transmitting the signal, said lead 253 being connectable to a signal processing circuit 260, which is placed in a second screened chamber 252 in order not to affect the circuit 140 placed in a first screened chamber 251, and which is intended to process the signal received from the lead 133 of the Rogowski coil 130.

The capacitive sensor 250-252 can also be used as a passive detector of the presence or absence of voltage, by providing a voltage presence detection output, such as a voltage presence indicator lamp 210 connected to said sensor 250-252 by a corresponding lead 211.

Description of the Third Embodiment

Figure 3A:
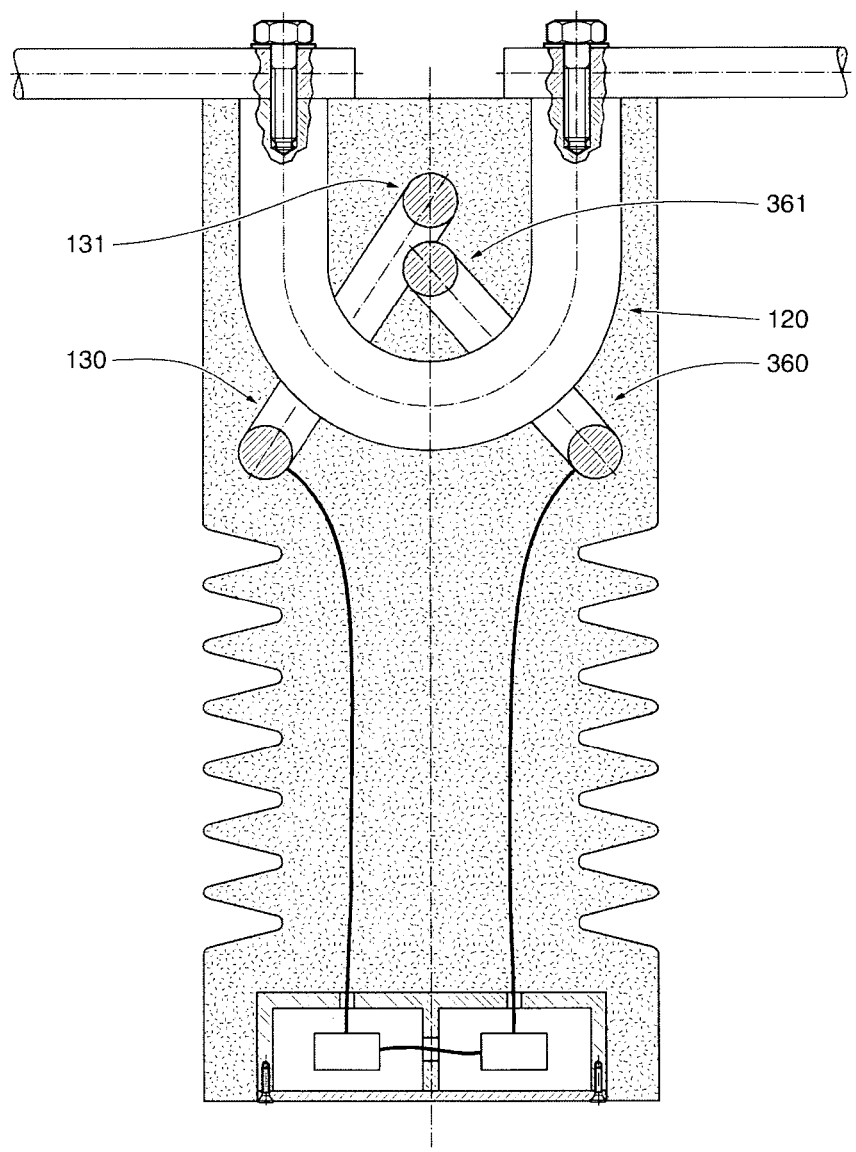

FIGS. 3 and 3A

With reference to FIG. 3, this shows a third embodiment of the construction system proposed by the present invention, intended to provide a sensor indicated here by 300, extending along an axis Y-300.

This third embodiment differs from the first embodiment shown in FIG. 1 in that it also comprises a second coil 360, having a ferromagnetic core, placed around said U-shaped conducting bar 120, with at least a proximal portion 361 of this coil placed between the arms of said U-shape and to the side of the proximal portion 131 of the first Rogowski coil 130.

The second coil 360, which has a ferromagnetic core, is preferably screened, with the screen connected to earth or to a reference potential, for example by means of a lead (not shown) connected to a screening element 150, described more fully below, this element being connected to earth or to a reference potential.

The first coil 130 and the second coil 360 have a first lead 133 and a second lead 363 respectively, for transmitting the corresponding signals, the first lead 133 being connected to a first signal processing circuit 140 and the second lead 363 being connected to a second circuit 370, the latter being intended to generate, by using the received signal, a supply voltage at a suitable level to supply this first circuit 140 and/or other circuits.

Preferably, said first circuit 140 and said second circuit 370 are placed inside corresponding screened chambers 351 and 352, which communicate with each other by means of a screened conduit 354 formed in a partition 353 of the screening element 150, the supply cable 355 being placed in this conduit 354.

With reference to FIG. 3A, this shows said third embodiment in a variant arrangement having the same technical and functional elements, in which, more specifically, the proximal portions 131 and 361 of the two coils 130 and 360 are placed one above the other and still between the arms of said U-shape, and in which, preferably, this configuration is produced by designing said two coils 130 and 360 with different reference diameters.

Description of the Fourth Embodiment

Figure 4A:
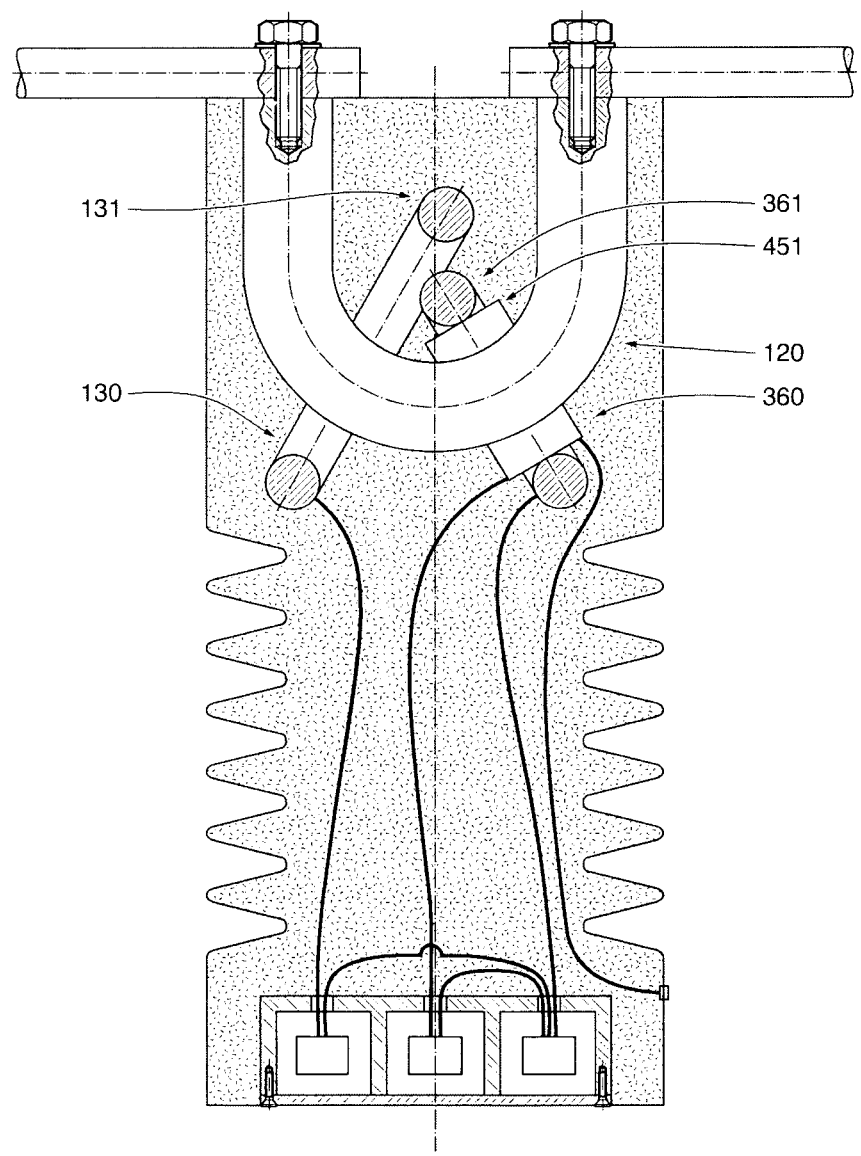

FIGS. 4 and 4A

With reference to FIG. 4, this shows a fourth embodiment of the construction system proposed by the present invention, intended to provide a sensor indicated here by 400, extending along an axis Y-400.

This fourth embodiment differs from the third embodiment shown in FIG. 3 in that it also contains a capacitive sensor 450 placed in the proximity of said U-shaped bar with at least one proximal portion, 451, of this sensor placed between the arms of said U-shape.

In this exemplary embodiment, said capacitive sensor 450 comprises a first metal capacitor armature 452, preferably ring-shaped, made from sheet metal and/or metal mesh and/or other material, said first armature 452 being placed around the U-shaped bar 120 and being spaced from it by the dielectric material, the U-shaped bar acting as a second metal armature of said capacitive sensor 450, and, more specifically and preferably, said first armature 452 being placed and positioned circumferentially in the proximity of the inner diameter of the Rogowski coil 130.

Said capacitive sensor 450 with its capacitor armature 452 is provided with a corresponding lead 453 for transmitting the signal, said lead 453 being connected to a signal processing circuit 460, and said processing circuit 460 being placed inside a second screened chamber 454.

In this configuration, the first Rogowski coil 130 is provided with a corresponding first lead 133 for transmitting the corresponding signal, the second coil 360 with a ferromagnetic core is provided with a corresponding second lead 363 for transmitting the corresponding signal, and the electrical field sensor 450-452 is provided with a corresponding third lead 453 for transmitting the corresponding signal.

In the proximity of the distal portion of the sensor 400, said first lead 133 is connected to a first signal processing circuit 140, said second lead 363 is connected to a second signal processing circuit 370 for generating a supply voltage, and said third lead 453 is connected to a third signal processing circuit 460, said second circuit 370 being connected to said first 140 and said third 460 circuits in order to supply them.

As in the preceding cases, one or more of said circuits 140, 460, 370 is placed inside a corresponding screened chamber 451, 452, 453.

The capacitive sensor 450-452 can also be used as a passive detector of the presence or absence of voltage, by providing a voltage presence detection output, such as a voltage presence indicator lamp 410 connected to said sensor 450-452 by a corresponding lead 411.

With reference to FIG. 4A, this shows said fourth embodiment in a variant arrangement having the same technical and functional elements, in which, more specifically, the proximal portions 131, 361 and 451 of the first coils 130, the second coil 360 and the capacitor armature 450-452 respectively are placed one above the other and again between the arms of said U-shape, and in which, preferably, this configuration is produced by designing said two coils 130 and 360 with different reference diameters.

Description of the Fifth Embodiment

FIG. 5, 5A, 5B, 5C

With reference to FIG. 5, this shows a fifth embodiment of the configuration proposed by the present invention, intended to provide a sensor indicated here by 500, extending along an axis Y-500.

This fifth embodiment differs from the first embodiment shown in FIG. 1 in that it also comprises a source electrode 510 and an electrical field sensor 520.

The source electrode 510 extends longitudinally along its axis Y-510 which is preferably placed coaxially with the longitudinal axis Y-500 of the sensor 500, and said source electrode 510 has its proximal end 511 connected to said U-shaped conducting bar 120 and its opposite distal end 512 left free.

The electrical field sensor 520 is electrically isolated and is positioned axially in the proximity of, but spaced apart from, the distal end 512 of said source electrode 510, thus forming a capacitive sensor.

Preferably, in order to make said capacitive sensor 510-520 immune to the surrounding electrical fields which may, for example, be generated by other busbars located in the vicinity, said sensor 500 additionally comprises a screening tubular element 530 which forms a first screened chamber 531 having a first open proximal end 532 facing the U-shaped conducting bar 120, said source electrode 510 passing through said first open end 532 and having its distal portion placed inside said first screened chamber 531 in which the field sensor 520 is also placed.

The screening element 530 also comprises a second screened chamber 551 and a third screened chamber 552 formed in a distal portion of the screening element 530, together with a central conduit 534 to enable said first screened chamber 531 to communicate with said third screened chamber 552, a conducting cable 521 being placed in said first conduit 534 to connect said electrical field sensor 520 to a first circuit 540.

Said screening element 530 can also comprise a second screened conduit 535, extending longitudinally on one side of the screening element 530, a conducting cable 133 being placed in said second conduit 535 to connect said Rogowski coil 130 to a second circuit 550 for processing the received signal.

Again, said screening element 530 preferably comprises branches 560 for supporting and positioning said Rogowski coil 130 with respect to said U-shaped conducting bar 120.

Preferably, the branches 560 can also act as conductors, for connecting the screen of the coil 130 to the screening element 530, which in turn is connected to earth or to a reference potential.

Description of the Sixth Embodiment

FIG. 6

With reference to FIG. 6, this shows a sixth embodiment of the configuration proposed by the present invention, intended to provide a sensor indicated here by 600, extending along an axis Y-600.

This sixth embodiment differs from the fifth embodiment shown in FIG. 5 in that it also comprises a second coil 610, having a ferromagnetic core, placed around said U-shaped conducting bar 120, with at least a proximal portion 611 of this coil placed between the arms of said U-shape and also, preferably, a further axial conduit 620.

In this sixth embodiment, the first Rogowski coil 130 is provided with a corresponding first lead 133 for transmitting the corresponding signal, the electrical field sensor 520 is provided with a corresponding second lead 521 for transmitting the corresponding signal, and the second coil 610 with a ferromagnetic core is provided with a corresponding third conductor 612 for transmitting the corresponding signal.

The first conductor 133 is connected to a first signal processing circuit 550, the second conductor 521 is connected to a second signal processing circuit 540, and the third conductor 612 is connected to a third circuit 630 for generating a supply voltage at a suitable level for supplying this first 550 and second 540 circuit and/or other circuits, said first circuit 550 and said second circuit 540 being placed inside screened chambers 651 and 652 respectively.

Preferably, this second coil 610 can also be supported by branches 560 which, if desired, can also act as conductors, for connecting the screen of the aforesaid second coil 610 to the screening element 530, which in turn is connected to earth or to a reference potential.

The above description of the construction system for producing a capacitive sensor for detecting an electrical field is provided solely by way of non-limiting example, and clearly, therefore, said configuration can be modified or varied in any way suggested by experience and/or its use or application within the scope of the following claims.

The following claims consequently also form an integral part of the above description.

The invention claimed is:

1. A current or voltage sensor for use with a busbar extending along a busbar axis, the sensor comprising:
    a support body extending transversely of the axis and having a proximal end juxtaposed with the busbar and a distal end spaced therefrom;
    a U-shaped conducting bar in the proximal end, extending transversely of the busbar axis, and having a pair of arms spaced axially of the busbar axis and having free ends transversely engaging the busbar;
    a Rogowski coil in the proximal end juxtaposed with the U-shaped conducting bar;
    a grounded screening element at the distal end, formed of conductive material, and forming a first screened chamber open transversely toward the U-shape conducting bar;
    a source electrode extending transversely of the busbar axis and having a proximal end engaging the U-shaped conducting bar outside the first chamber and a distal end in the first chamber; and
    an electrical field sensor in the first chamber juxtaposed with the distal end of the source electrode.

2. The current or voltage sensor according to claim 1, wherein the U-shaped conducting bar, the Rogowski coil and the source electrode are placed and positioned with respect to each other by embedding and incorporation in a solid body of dielectric material forming the support body.

3. The current or voltage sensor according to claim 1, wherein the screening element also forms a first conduit through which the first screened chamber communicates with a third screened chamber and in that the first conduit holds a conducting cable connecting the electrical field sensor to a circuit in the third screened chamber.

4. The current or voltage sensor according to claim 1, wherein the screening element also forms a second screened conduit extending transversely of the busbar axis, from and communicating with a second screened chamber, and in that the second conduit holds a conducting cable intended to connect the Rogowski coil to a circuit in the second screened chamber.

5. The current or voltage sensor according to claim 1, wherein the screening element comprises branches for supporting and positioning the Rogowski coil with respect to the U-shaped conducting bar.

6. The current or voltage sensor according to claim 5, wherein the branches act as leads for connecting the screen of a screened coil to the screening element.

7. The current or voltage sensor defined in claim 1, wherein the source electrode and the U-shaped conducting bar are centered on an electrode axis substantially perpendicular to the busbar axis.

8. The current or voltage sensor defined in claim 7, wherein the distal end of the source electrode is spaced along the electrode axis from the electrical field sensor.

* * * * *